United States Patent
Licato et al.

(10) Patent No.: US 7,047,062 B2
(45) Date of Patent: May 16, 2006

(54) MAGNETIC RESONANCE IMAGING WITH NESTED GRADIENT PULSES

(75) Inventors: Paul E. Licato, Wauwatosa, WI (US); Steven Wolff, New York, NY (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 630 days.

(21) Appl. No.: 10/063,826

(22) Filed: May 16, 2002

(65) Prior Publication Data

US 2003/0216633 A1    Nov. 20, 2003

(51) Int. Cl.
*A61B 5/05*    (2006.01)
(52) U.S. Cl. .............. 600/410; 324/306; 324/307; 324/309
(58) Field of Classification Search ........ 600/407–425; 324/306–309
See application file for complete search history.

(56) References Cited

U.S. PATENT DOCUMENTS

| | | | |
|---|---|---|---|
| 4,689,563 A * | 8/1987 | Bottomley et al. | 324/309 |
| 5,122,748 A * | 6/1992 | Oh et al. | 324/309 |
| 5,530,354 A | 6/1996 | Herlihy et al. | 324/318 |
| 5,539,316 A * | 7/1996 | Sukumar | 324/320 |
| 5,604,435 A | 2/1997 | Foo et al. | 324/309 |
| 5,869,965 A * | 2/1999 | Du et al. | 324/309 |
| 5,952,827 A | 9/1999 | Feinberg | 324/309 |
| 6,023,634 A * | 2/2000 | Hanawa et al. | 600/410 |
| 6,198,282 B1 | 3/2001 | Dumoulin | 324/307 |
| 6,320,377 B1 * | 11/2001 | Miyazaki et al. | 324/306 |

* cited by examiner

*Primary Examiner*—Brian L. Casler
*Assistant Examiner*—Baisakhi Roy
(74) *Attorney, Agent, or Firm*—Cantor Colburn LLP

(57) ABSTRACT

Disclosed herein is a system and method for decreasing gradient field pulse sequence duration and reducing peripheral nerve stimulation with known gradient pulse areas for a magnetic resonance imaging system. The method comprising: receiving a first desired area corresponding to a first pulse; obtaining a second desired area corresponding to a second pulse; selecting the first pulse as a nested pulse if the first desired area is smaller than the second desired area, and establishing the second pulse as a nesting pulse, otherwise selecting the second pulse as the nested pulse and establishing the first pulse as the nesting pulse. The method also includes: determining an amplitude and pulse duration for the nested pulse and ascertaining an amplitude and pulse duration for the nesting pulse. Finally, the method includes arranging a plurality of gradient field pulse sequences to include the nested pulse and the nesting pulse.

35 Claims, 7 Drawing Sheets

MAGNETIC RESONANCE IMAGING WITH NESTED GRADIENT PULSES

BACKGROUND OF INVENTION

The field of the invention is nuclear magnetic resonance imaging methods and systems. More particularly, the invention relates to a method and system for nesting gradient pulses to allow increased gradient slew rates and reduced peripheral nerve stimulation. It will be appreciated, however, that the invention is also amenable to other like applications.

Magnetic resonance imaging is a diagnostic imaging modality that does not rely on ionizing radiation. Instead, it uses strong (ideally) static magnetic fields, radio-frequency (RF) pulses of energy and magnetic field gradient waveforms. More specifically, MR imaging is a non-invasive procedure that uses nuclear magnetization and radio waves for producing internal pictures of a subject. Three-dimensional diagnostic image data is acquired for respective "slices" of an area of the subject under investigation. These slices of data typically provide structural detail having a resolution of one (1) millimeter or better.

When utilizing NMR to produce images, a technique is employed to obtain NMR signals from specific locations in the subject. Typically, the region that is to be imaged (region of interest) is scanned by a sequence of NMR measurement cycles, which vary according to the particular localization method being used. The resulting set of received NMR signals are digitized and processed to reconstruct the image using one of many well-known reconstruction techniques. To perform such a scan, it is, of course, necessary to elicit NMR signals from specific locations in the subject. This is accomplished by employing gradient magnetic fields denoted ($G_{SLICE}$, $G_{PHASE\ ENCODE}$, and $G_{READOUT}$) which have the same direction as the polarizing field $B_0$, but which are configured as needed to select the slice, phase encode and readout to facilitate the imaging. By controlling the strength of these gradients during each NMR cycle, the spatial distribution of spin excitation can be controlled and the location of the resulting NMR signals can be identified.

The magnetic field gradient subsystem of an MRI system is perhaps the most critical subsystem in defining the utility of a scanner. A more powerful gradient subsystem, in general, yields greater applications capability. Gradient field performance is dependent on two factors: maximum gradient amplitude and gradient pulse slew-rate. Gradient amplitude is determined by the current that the gradient amplifiers produce in the gradient coils, and gradient slew rate is the rate at which the gradient amplifiers can change the gradient amplitude.

In many circumstances, the only factor of importance in the generation of a gradient field pulse is the integral of gradient amplitude over the duration of the gradient pulse (i.e. the gradient pulse area). This is true, for example, with slice-select refocusing, phase-encoding, velocity or flow compensation, spoiling, rewinding and readout defocusing gradient pulses. Since the shortest duration gradient pulse of a given area provides the greatest flexibility in selecting pulse sequence echo time (TE) and pulse sequence repetition time (TR), it is highly desirable for the MRI system to produce these gradient pulses with the minimum pulse duration possible given the prescribed pulse area.

For a given gradient subsystem, the minimum pulse duration is obtained with a triangular pulse. In such a case, a gradient amplifier is changing the gradient amplitude rapidly until the amplitude reaches a predetermined value. The gradient amplifier then returns the amplitude to zero at a rapid rate. The maximum rate that the gradient amplifier can change the gradient amplitude is established by the slew rater of the gradient amplifier given in units of Gauss per centimeter per millisecond (G/cm/ms). Ideally, a triangular pulse is the shortest possible gradient pulse for a given gradient amplifier since the gradient amplifier is changing the gradient amplitude at the maximum rate, established/limited by design. A real gradient amplifier, however, has a limit to the amplitude of gradient pulses it can produce. Consequently, when the gradient amplifier must formulate a gradient pulse having an area greater than that of a triangular pulse with the maximum allowable amplitude, the gradient pulse providing optimal duration becomes a trapezoid. As with the triangular pulse the gradient amplitude rises at a rapid rate until the maximum gradient, $G_{max}$, is reached. The gradient amplifier then provides constant gradient amplitude for a period PW, followed by a rapid return to zero amplitude. For the minimum duration gradient pulse, the constant amplitude is applied at the design limit of the gradient amplifier.

The desired area of a gradient pulse is typically determined by scan parameters such as the field-of-view and slice thickness, which are input by the operator just prior to a scan. Once the desired area is known, then the MRI system uses the slew rate and maximum amplitude of the gradient amplifier to determine the timing and amplitude of the gradient pulse. If the slew rate and maximum amplitude of the gradient system are sufficiently high, a triangular gradient waveform, will be produced. Otherwise, a longer trapezoidal gradient waveform must be produced with a consequent lengthening of the minimum possible pulse sequence echo time TE and pulse sequence repetition time (TR).

While one could increase the power of the gradient amplifiers such that the maximum prescribed gradient area can be produced with a triangular gradient pulse regardless of its size, this may not solve the problem, and may present others. Namely, due to physiological effects on the patient, because constraints are placed on maximum gradient switching speed (slew rate) for the gradient fields allowed. Time-varying magnetic fields induce currents in conductive materials and rapidly changing magnetic field gradients can induce currents in a patient being imaged. Under some circumstances, these induced currents can stimulate nerves. Therefore, every MRI pulse sequence employed for human patients must conform to one or more magnetic field rate of change limitations in accordance with FDA regulations. Thus, it is now evident, that even though the gradient amplifiers can deliver a desired triangular gradient pulse of prescribed area to meet the desired requirements, physiological limits may preclude its use. Current MRI systems, therefore, assume the worst possible circumstances and limit the gradient slew rate accordingly.

Most physiological limits placed on the gradient field rate of change are not a single fixed value. Instead, the limit changes as a function of the "transition time" (i.e. the time interval over which the change in gradient field occurs). The reason for allowing higher rates of change (i.e. dB/dt) as the transition time decreases is related to the fact that the electrical sensitivity of neurons decrease with increasing frequency. J. P. Reilly of the Johns Hopkins University Applied Physics Lab has modeled the response of nerve cells and produced an equation predicting the dB/dt threshold for peripheral (PNST) and cardiac nerve stimulation as a function of dB/dt and pulse duration. It should be noted that cardiac stimulation occurs at dB/dt levels about 10 times that of PNST, therefore, a wide margin of safety is realized.

The Reilly PNST equation, known as the "Reilly Curve," is the basis for the FDA physiologic limits on dB/dt.

All gradient coil designs intended for human use will have a physiologic limit given by the Reilly equation. The slew rate, which gives the limit, however, will depend on the effective length of the coil. The physiologic slew rate limit is determined by dividing the Reilly limit by the effective length of the gradient coil, L. Note that, the effective length L is not necessarily the true length of the coil. Rather, the effective length is the distance between the iso-center of the gradient coil and the point within the coil that exhibits the maximum dB/dt exposure for the patient (or operator). This distance should be corrected for deviations from non-linearity. For a cylindrical gradient coil, this distance is roughly equal to the distance from the iso-center of the gradient coil to the location of maximum field variation caused by the coil in the Z direction. In the radial dimensions, however, this distance is equal to the patient-bore radius because the location of maximum field variation is within the walls of the MR system.

Most NMR scans currently used to produce medical images require many minutes to acquire the necessary data. The reduction of this scan time is an important consideration, since reduced scan time increases patient throughput, improves patient comfort, and improves image quality. Thus, it can be seen that there is a need to provide minimum duration gradient pulses that do not operate beyond the physiological limits.

SUMMARY OF INVENTION

The above discussed and other drawbacks and deficiencies are overcome or alleviated by a system and method for decreasing gradient field pulse sequence duration and reducing peripheral nerve stimulation with known gradient pulse areas for a magnetic resonance imaging system. The method comprising: receiving a first desired area corresponding to a first pulse; obtaining a second desired area corresponding to a second pulse; selecting the first pulse as a nested pulse if the first desired area is smaller than the second desired area, and establishing the second pulse as a nesting pulse, otherwise selecting the second pulse as the nested pulse and establishing the first pulse as the nesting pulse. The method also includes: determining an amplitude and pulse duration for the nested pulse and ascertaining an amplitude and pulse duration for the nesting pulse. Finally, the method includes arranging a plurality of gradient field pulse sequences to include the nested pulse and the nesting pulse.

Also disclosed is a storage medium encoded with a machine-readable computer program code including: instructions for causing a computer to implement the above-mentioned method for decreasing gradient field pulse sequence duration and reducing peripheral nerve stimulation with known gradient pulse areas for a magnetic resonance imaging system.

Further disclosed is a computer data signal comprising code configured to cause a processor to implement the abovementioned method for decreasing gradient field pulse sequence duration and reducing peripheral nerve stimulation with known gradient pulse areas for a magnetic resonance imaging system.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several Figures.

DETAILED DESCRIPTION

Disclosed herein is another method and system for reducing gradient pulse durations and thereby reducing TE and TR. The method includes nesting of selecting gradient pulses to reduce the overall length of the set of gradient pulses and thus the reducing the total cycle time for acquiring the images.

To improve MR methods and scans, it is desirable to minimize the duration of the gradient pulses. Increasing the slew rate will have the effect of reducing pulse duration. However, important physiological limits must be considered. Slew rates that create dB/dt above threshold levels, established for example by the Reilly equation, may induce nerve stimulation in patients. For any gradient coil, dB/dt is directly proportional to the slew rate, and varies as a function of position in and around the gradient coil. The geometry of the coil will also have a substantial effect. For example, the maximum dB/dt in a shorter cylindrical coil will be lower than the maximum dB/dt in a longer coil. Moreover, there is an upper limit to the amount of usable electrical current (and by extension power) for all gradient subsystems, and this upper limit is defined solely by the threshold of physiological stimulation and the maximum gradient pulse area for all applications.

A method for calculating the shortest possible gradient pulse for a prescribed gradient pulse is described in U.S. Pat. No. 6,198,282. In this patent, a method is described to calculate the slew rate and amplitude of each gradient pulse, and to minimize the gradient pulse duration while addressing physiologic effects. The methods described therein, enables the gradient amplitude to be determined to achieve the minimum duration gradient pulse with the given slew-rate limitation. Thereby the echo time (TE) and repetition time (TR) can be optimized for the specified pulse sequence. Moreover, the gradients produced by the gradient subsystem were de-rated to avoid operation beyond the Reilly curve, yet provide minimum duration gradient pulses. The approach disclosed herein, improves upon the abovementioned reference by nesting selected portions of the gradient waveforms, and thereby further reduces gradient pulse sequence durations and thus, further reducing TE and TR.

The method includes nesting of selected gradient slews and pulses to reduce the overall duration of the gradient pulse sequences and thus the reducing the total cycle time for acquiring the images.

Figure 1:
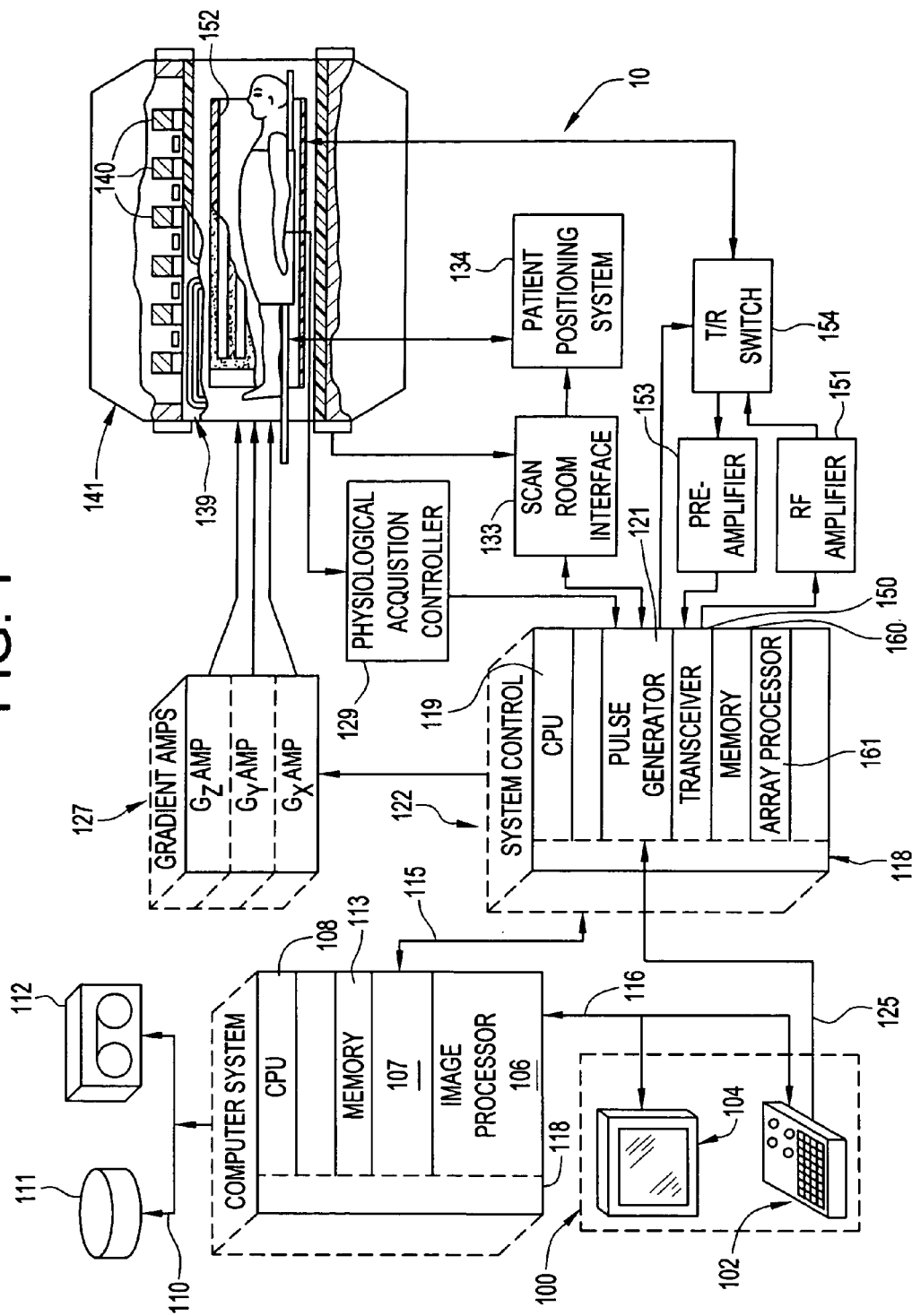
FIG. 1 depicts an exemplary MRI system.

Referring to FIG. 1, there is shown the major components of an exemplary MRI system, within which an exemplary embodiment may be implemented. The operation of the system is controlled from an operator console 100, which includes a keyboard and control panel 102 and a display 104. The console 100 communicates through a link 116 with a separate computer system 107 that enables an operator to control the production and display of images on the screen 104. The computer system 107 includes a number of modules, which communicate with each other through a backplane. These include an image processor module 106, a CPU module 108 and a memory module 113, known in the art as a frame buffer for storing image data arrays. The computer system 107 is linked to storage media 111 and 112, depicted as disk storage and a tape drive respectively for storage of image data and programs, and it communicates with a separate system control 122 through a high speed serial link 115.

The system control 122 includes a set of modules connected together by a backplane 118. These include a CPU module 119 and a pulse generator module 121, which connects to the operator console 100 through a serial link 125. It is through this link 125 that the system control 122 receives commands from the operator that indicate the scan sequence that is to be performed. As will be described in more detail below, the operator enters parameters, which indicate the prescribed scan. From these parameters, a pulse sequence is calculated and downloaded to the pulse generator module 121.

The pulse generator module 121 operates the system components to carry out the desired scan sequence. It produces data, which indicates the timing, strength and shape of the RF pulses that are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. Finally, the pulse generator module 121 connects to a scan room interface circuit 133, which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier 127 comprised of $G_x$, $G_y$, and $G_z$ amplifiers. Each gradient amplifier 127 excites a corresponding gradient coil in an assembly generally designated 139 to produce the magnetic field gradients used for position encoding acquired signals. The gradient coil assembly 139 forms part of a magnet assembly 141, which includes a polarizing magnet 140 and a whole-body RF coil 152. A transceiver module 150 in the system control 122 produces pulses, which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the RF coil 152 during a transmit mode and to connect the preamplifier 153 during a receive mode. The transmit/receive switch 154 also enables a separate RF coil 152 (for example, a head coil or surface coil) to be used in either the transmit mode or receive mode.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in a storage medium 111 or 112 such as disk memory or tape drive. The storage medium 111 and 112 could be various storage methodologies, such as disk, static memory, solid state, removable media, and the like, as well as combinations including at least one of the foregoing. In response to commands received from the operator console 100, this image data may be archived on the tape drive, or it may be further processed by the image processor 106, and conveyed to the operator console 100 and presented on the display 104.

Referring still to FIG. 1 the NMR signal produced by the subject is picked up by the receiver coil 152 and applied through the preamplifier 153 to the input of a transceiver 150. The received signal is at or around the Larmor frequency, and this high frequency signal is down converted in a two-step process, which first mixes the NMR signal with a carrier signal and then mixes the resulting difference signal with a reference signal. The down converted NMR signal is applied to the input of an analog-to-digital (A/D) converter, which samples and digitizes the analog signal and applies it to a digital detector and signal processor which produces in-phase (I) values and quadrature (Q) values corresponding to the received NMR signal. The resulting stream of digitized I and Q values of the received signal are output through backplane 118 to the memory module 160 and array processor 161 where they are employed to reconstruct an image.

Figure 2:
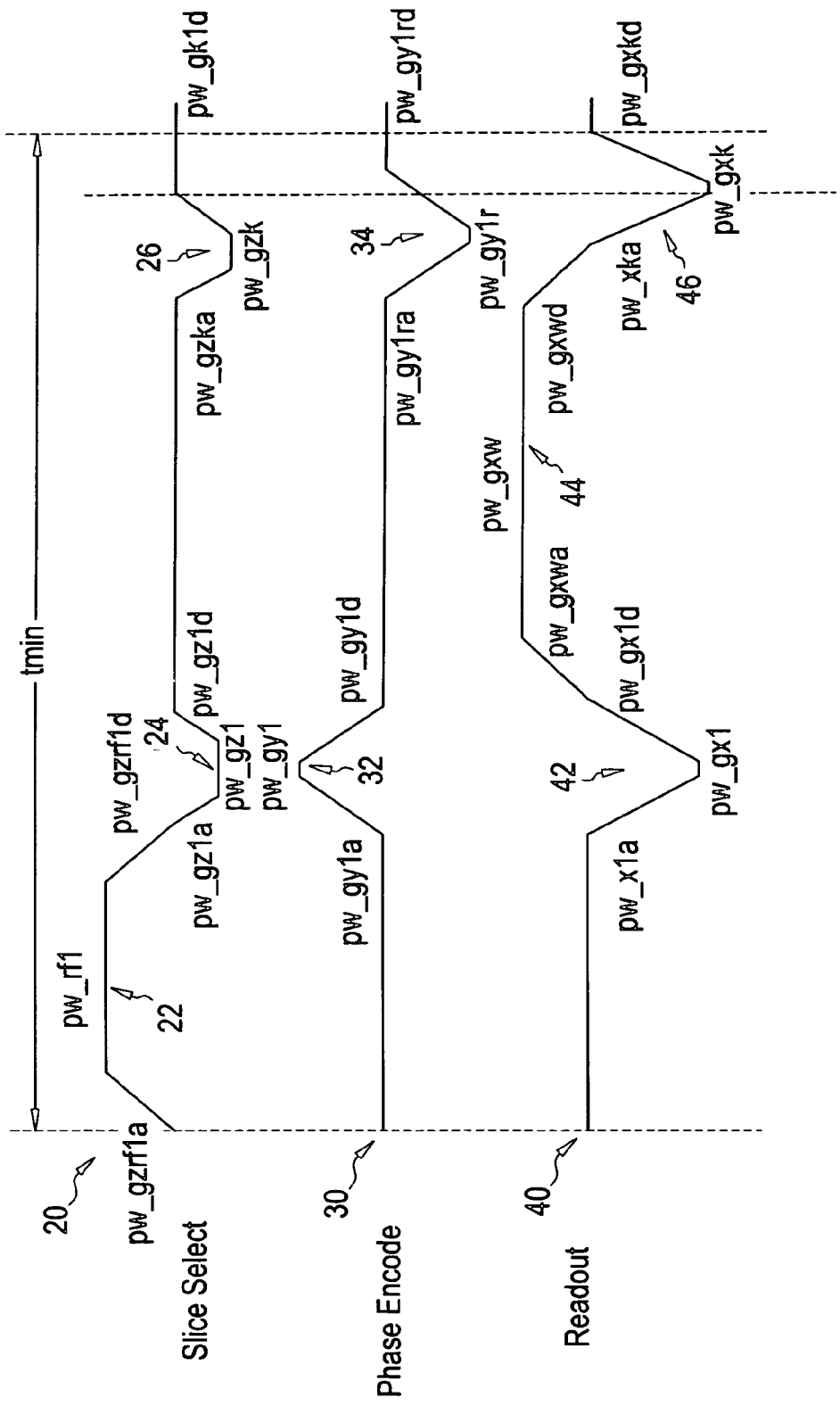
FIG. 2 is a graphic representation of a conventional gradient sequence.

Referring to FIG. 2, a graphic representation of an exemplary gradient sequences are depicted. The gradient magnetic field sequences denoted ($G_{SLICE}$, $G_{PHASE}$, and $G_{READOUT}$) which have the same direction as the polarizing field $B_0$, but which have a gradient along the respective z, y and x axes. It will be appreciated, that $G_{SLICE}$, $G_{READOUT}$ and $G_{PHASE}$ may be applied on any physical gradient axes $G_x$, $G_y$, $G_z$, or any linear combination thereof, depending on the selected orientation for the slice. The slice select pulse sequence, $G_{SLICE}$ 20 includes, but is not limited to, a slice select pulse 22, a rephaser pulse 24, and a killer or dephaser pulse 26. The phase encoding pulse sequence, $G_{PHASE}$ 30 includes, but is not limited to, the phase encoding pulse(s) 32 and phase rewinder pulse(s) 34. Lastly, the readout pulse sequence, $G_{READOUT}$ 40 includes, but is not limited to, a prephaser pulse 42, a readout pulse 44, and a killer or dephaser pulse 46.

Figure 3:
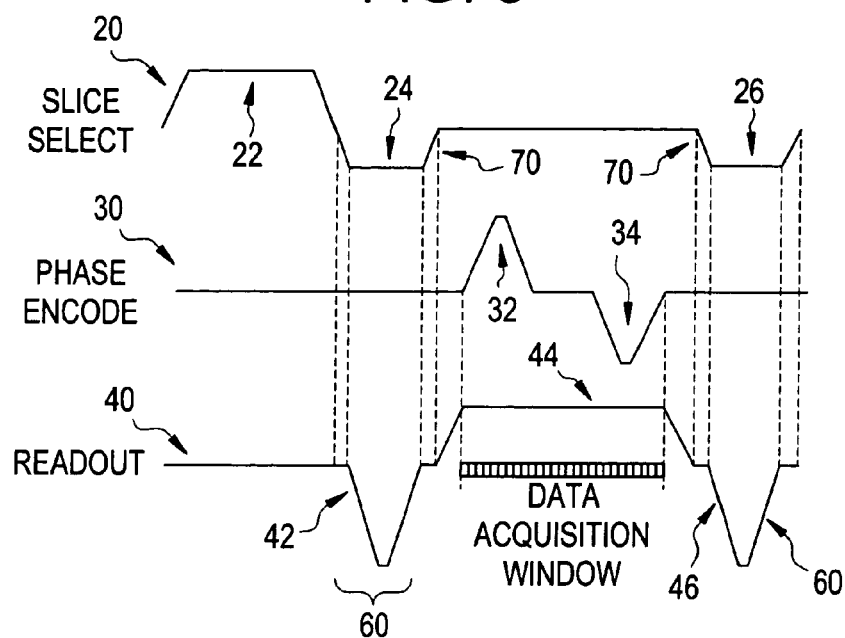
FIG. 3 is a graphic representation of a gradient sequence employing an exemplary embodiment.

Referring now to FIG. 3, a graphical representation of a gradient sequence employing an exemplary embodiment of the invention is depicted. The gradient magnetic field pulses as described and depicted from FIG. 2 are reconfigured in a manner, which ensures that the pulses for slice selection gradient field and the readout field are nested or coincident. More particularly, the slewing portions of the pulses of the gradient field sequences are arranged to minimize any occurrence of more than one gradient field slewing simultaneously. In an exemplary embodiment, the pulse sequences e.g., 20, 30, and 40 are initiated with the complete slice select pulse 22 in the slice select pulse sequence 20. Thereafter, the initial (e.g., first in time and denoted generally as 52 in FIG. 9), slew 52 of the slice select rephaser pulse 24 is generated, with the readout prephaser pulse 42, nested in the non-slewing e.g., flat top or unchanging field, portion of the slice select rephaser pulse 24. Thereafter, the initial slew 52 for the readout pulse 44 of the readout pulse sequence 40 starts just after the completion of the terminal slew (e.g., later in time and denoted generally as 54 in FIG. 9) of the slice select rephaser pulse 24. This embodiment places a the entire phase encoding pulse(s) 32 and phase encoding rewinder pulse(s) 34 of the phase pulse sequence 30 within the readout pulse 44, during which the echo is being captured. The phase encoding pulse(s) 32 and their corresponding rewinder pulse(s) 34 all occur during the non-slewing portion of the readout pulse 44. At the termination of the readout pulse 44 (following echo acquisition), the slice select dephaser pulse 26 of the slice select pulse sequence 20 slews with the readout dephaser pulse 46 of the readout pulse sequence 40 nested therein. This embodiment is beneficial because it represents the simplest configuration for the gradient pulse sequences e.g., 20, 30, and 40. Furthermore, it will be appreciated that the pulse sequences could readily be rearranged with the slice select rephaser pulse 24 and dephaser pulse 26 nested within the non-slewing portion of the readout prephaser pulse 32 and readout dephaser pulse 46 respectively.

Figure 4:
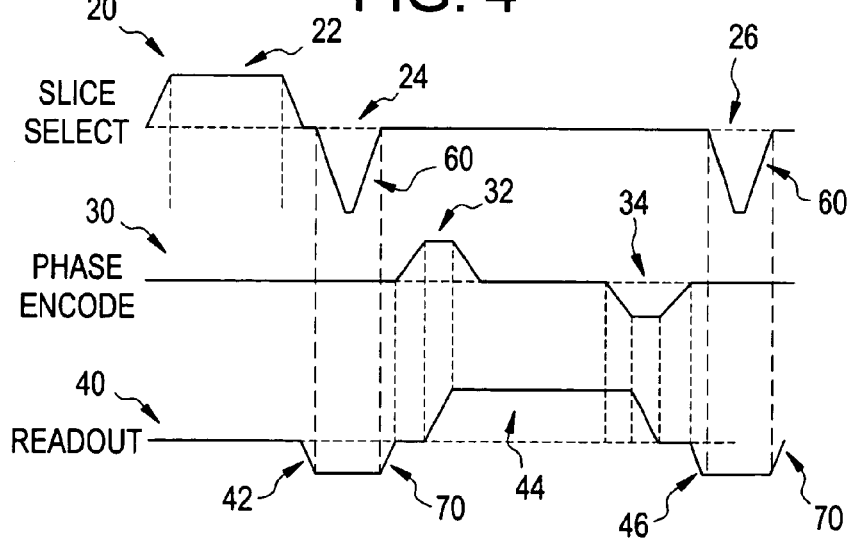
FIG. 4 is a graphic representation of a gradient sequence employing an alternative embodiment.

FIG. 4 depicts a graphical representation of a gradient sequences e.g., 20, 30, and 40 for an alternative embodiment. It should be noted that this sequence is similar to that described above, except that the slice select rephaser pulse 24 and dephaser pulse 26 are nested during the non-slewing portions of the readout prephaser pulse 42 and dephaser pulse 46 respectively. Additionally, the initial slew 52 for the phase encoding pulse(s) 32 and the terminal slew 54 for the phase rewinder pulse(s) 34 are placed outside the readout pulse 44 of the readout pulse sequence 40. Namely, the initial slew 52 for the phase encoding pulse(s) 32 is placed in between the terminal slew 54 of the readout prephaser pulse 42 and the initial slew 52 of the readout pulse 44. In this embodiment, the gradient magnetic field pulses as described and depicted from FIG. 2 are once again, reconfigured in a manner, which ensures that the pulse for slice selection gradient field and the readout field are nested or coincident. Once again, in this alternative embodiment, the sequences are initiated with the complete slice select pulse 22. Thereafter, the initial slew of the readout prephaser pulse 42 is generated with the slice select rephaser pulse 24 nested in the non-slewing portion of the readout prephaser pulse 42. Thereafter, the initial slew 52 for the phase encoding pulse(s) 32 starts just after the completion of the readout prephaser pulse 42. During the non-slewing portions of the phase encoding pulse(s) 32 and their corresponding rewinder pulse(s) 34, the initial slew 52 and terminal slew 54 portions, respectively of the readout pulse 44 are generated. At the termination of the phase rewinder pulse(s) 34, the readout dephaser pulse 46 slews with the slice select dephaser pulse 26 nested therein.

Once again, it will be appreciated that the sequences described above could readily be rearranged with the readout prephaser pulse 42 and dephaser pulse 46 nested within the non-slewing portion of the slice select prephaser pulse 24 and slice select dephaser pulse 26 respectively.

Figure 5:
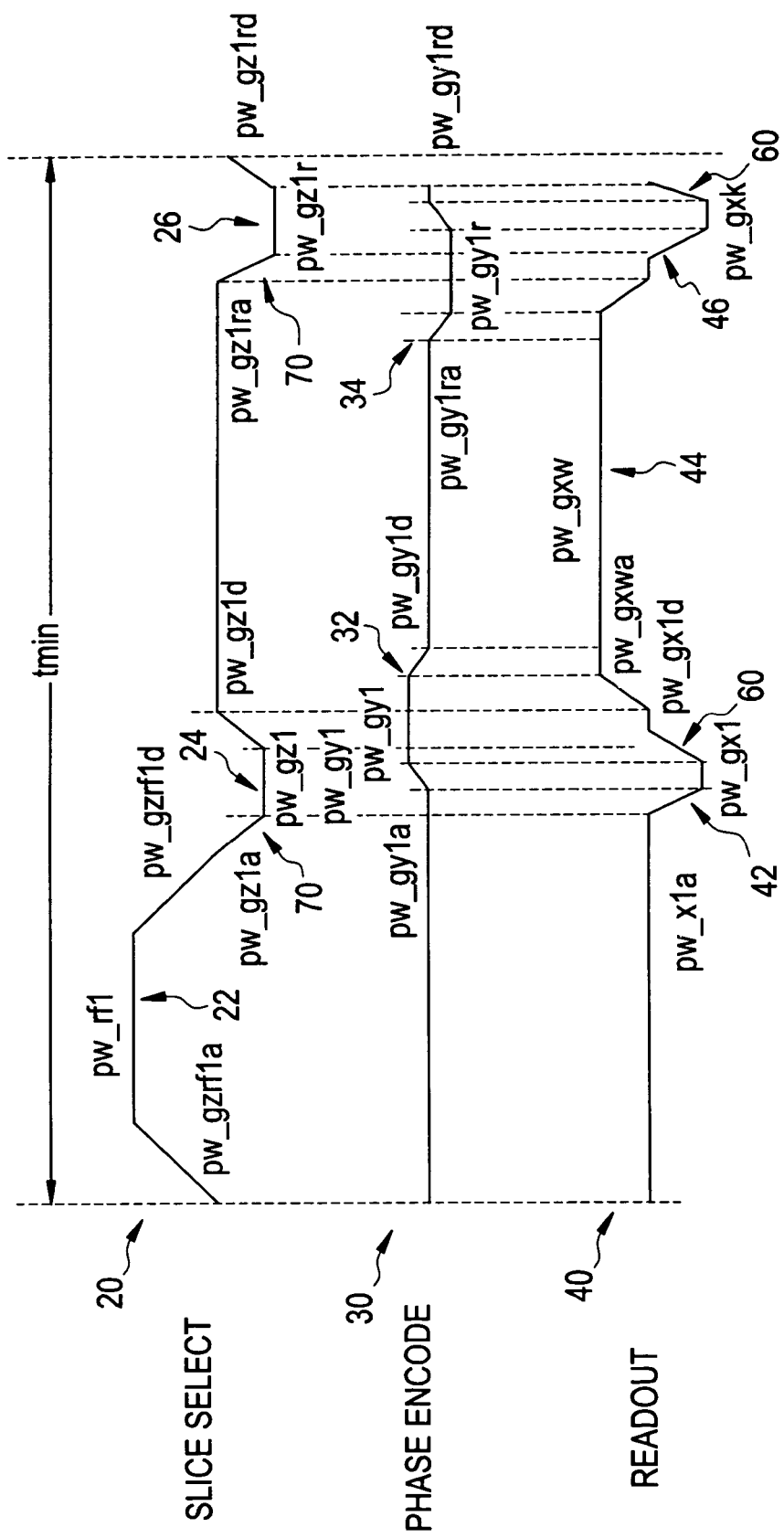
FIG. 5 is a graphic representation of a gradient sequence employing yet another alternative embodiment.

FIG. 5 depicts a graphical representation of a gradient sequence for yet another alternative embodiment. Once again, this sequence is similar to that described above, except that the slewing portions of the phase encoding pulse(s) 32 and phase rewinder pulse(s) are displaced even more from the readout pulse 44. In particular, the initial slew 52 of the phase encoding pulse(s) 32 is nested within both the slice select rephaser pulse 24 and readout prephaser pulse 42, while the terminal slew 54 of the phase encoding rewinder pulse(s) 34 is nested during the non-slewing portions of the slice select dephaser pulse 26 and readout dephaser pulse 46 respectively. Once again, in this alternative embodiment, the sequences are initiated with the complete slice select pulse 22. Thereafter, the initial slew 52 of the slice select rephaser pulse 24 is generated with the complete readout prephaser pulse 42 nested in the non-slewing portion of the slice select rephaser pulse 24. The slice select rephaser pulse 24 non-slewing portion is extended for the duration needed to complete the readout prephaser pulse 42. Unique in this embodiment, the initial slew 52 for the phase encoding pulse(s) 32 starts just after the completion of the initial slew 52 of readout prephaser pulse 42. The readout prephaser pulse 42 is limited to not stewing during the duration of the initial slew 52 of the phase encoding pulse 32. During the non-slewing portions of the phase encoding pulse(s) 32 the terminal slewing portions 54 of the slice select rephaser pulse 24 and the initial slew 52 of the readout pulse 44 are generated. Immediately following the completion of the initial slew 52 of the readout pulse 44, the terminal slew 54 phase encoding pulse(s) 34 is completed. Likewise, at the end of the echo acquisition, the initial slew 52 of the phase encoding rewinder pulse 34 is generated, followed thereafter by the terminal slew 54 of the readout pulse 44, and then the initial slew 52 of the slice select dephaser pulse 26. Nested completely within the non slewing portion of the slice select dephaser pulse 26 is the complete readout dephaser pulse 46. Moreover, nested in the non-slewing portion of the readout dephaser pulse 46 is the terminal slew 54 of the phase encoding rewinder pulse(s) 34. Lastly, at the completion of the terminal slew 54 of the readout dephaser pulse 46, the terminal slew 54 of the slice select dephaser pulse 26 is generated.

It should be appreciated that yet another embodiment could be conceived as a variation on the embodiment described above and depicted in FIG. 5. In this alternative embodiment, the slice select rephaser pulse 24 may instead be nested within the duration of the readout prephaser pulse 42, with the initial slew 52 of the phase encoding pulse(s) 32 being generated during the non-slewing portions of the slice select rephaser pulse 24. Likewise, the slice select dephaser pulse 26 may instead be nested within the duration of the readout dephaser pulse 46 with the terminal slew 54 of the phase encoding rewinder pulse(s) 34 being generated during the non-slewing portions of the slice select dephaser pulse 26.

Figure 6:
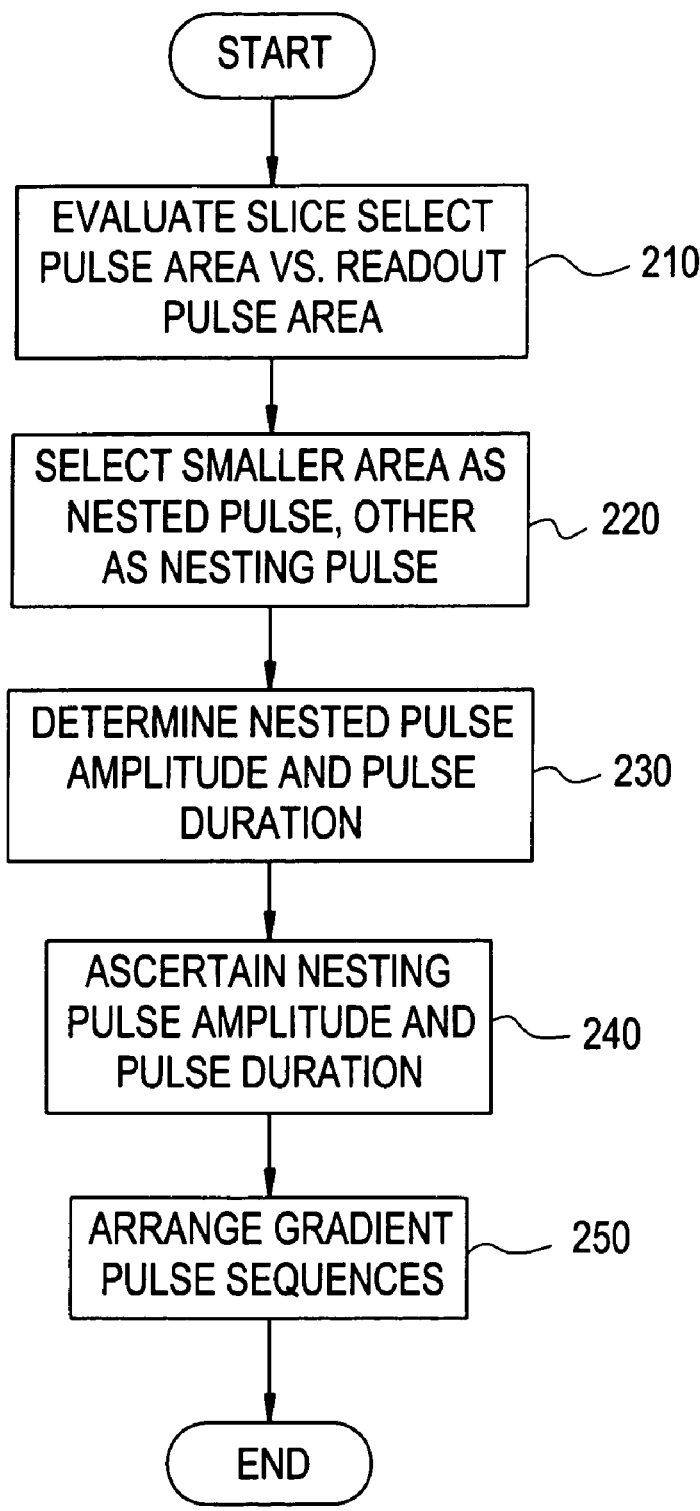
FIG. 6 is a flowchart depicting the method of acquisition for an exemplary embodiment.

Referring now to FIG. 6, a flow chart of the method employed in an exemplary embodiment is depicted. Disclosed herein is a method to configure a set of gradient field sequences including complete overlap of the phase encoding pulses with the readout window as depicted in FIG. 3. The method addresses a configuration for the slew rates, magnitudes and durations of the sequence pulses based upon particular constraints of the MRI system 10, the gradient amplifiers 127, as well as the limitations required by the Reilly equation to avoid peripheral nerve stimulation. For example, as stated earlier, the gradient amplifier 127 includes limitations as to the maximum field amplitudes and slew rates that it can produce. Additionally, to achieve desirable echo acquisition and for the reasons discussed above, it is known that for a given sequence the area of the various pulses is a primary consideration.

It should be appreciated that the method disclosed herein does not address the formulation of the slice select pulse 22, the phase encoding pulse(s) 32, the phase rewinder pulse(s) 34 or the readout pulse 44. These pulses are selected as a function of numerous elements including, but not limited to, the type of gradient sequence to be formulated, the imaging to be performed, the characteristics of the MRI system 10, the gradient amplifiers 127 and the like. Therefore, it will be appreciated that the method disclosed herein is directed to the sequencing and shaping of the various gradient pulses based upon a known or computed desired area for each pulse. Further, it is well appreciated that the areas of the slice select rephaser pulse 24 and dephaser pulse 26 are about equivalent. Moreover, their combined area should preferably be about equivalent to the area of the slice select pulse 22. Similarly, the area of the phase encoding pulse(s) 32 should preferably be about equivalent to the area of the phase encoding rewinder pulse(s) 34. Further, it is well appreciated that the areas of the readout prephaser pulse 42 and dephaser pulse 46 are about equivalent, and again, their combined area should preferably be about equivalent to the area of the readout pulse 44.

Referring again to FIG. 6, a method to configure a set of gradient field sequences is described for a configuration for the slew rates, magnitudes and durations of the sequence pulses based upon particular constraints of the MRI system 10, the gradient amplifiers 127, as well as the limitations required by the Reilly equation to avoid peripheral nerve stimulation. For example: for a given MRI system 10 with the following constraints and known parameters:

Known desired area for each pulse of the gradient field sequences

Maximum field amplitude=A=4 Gauss/centimeter (G/cm)

Maximum slew rate = $SR$
　　　= nominally 150 milli$Tesla$/meter/second(mT/m/s)
　　　= (4 G/cm)/(268 microseconds(ms))
　　　= 0.0149 G/cm/μs Minimum duration gradient pulse width for a known gradient amplifier is 4 μs in duration. Hence, a symmetric trapezoid pulse (or a minimum duration triangular pulse will actually have a flat top time of 8 μs. Therefore, strictly speaking, all gradient pulses generated are trapezoidal because achieving a pure triangular pulse is beyond the capabilities of the MRI system 10. The derivation is presented addressing the triangular pulse because ideally, a triangular pulse is desired as it provides the maximum area within a minimum duration.

Figure 7:
FIG. 7 depicts a triangular pulse area.
Figure 8:
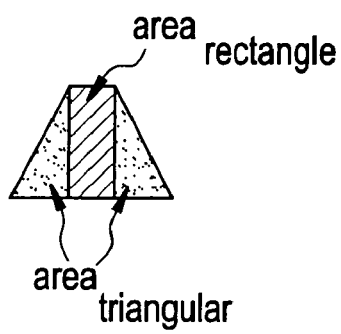
FIG. 8 depicts a trapezoidal pulse area.

Referring now to FIGS. 7 and 8, the area of a triangle is known to be:

areatriangle=½base*height=½tramp*Atriangle.

where tramp is the time duration of the ramp

Atriangle is the amplitude of the triangle areatriangular=2(½base*height)=2(½ tramp*Atriangle)=2(½ tramp*A$triangle$), areatriangular=tramp*Atriangle=tramp*A=(4 G/cm)/ SR(G/(cm*us))*(4 G/cm)

While the area of a rectangle is known to be:

arearectangle=tflattop*A

The desired area for a particular pulse is: areaDES (G/cm*μs)

For a desired triangular pulse:
If areaDES<=(4 G/cm)/(0.0149 G/cm/μs)*4 G/cm, then use a triangular waveform.

tramp=sqrt[areaDES/SR]sqrt[(G μs/cm)/(G/(cm*μs))]

A triangle=sqrt[areaDES(G μs/cm)*SR(G/(cm*μs))]

For a desired trapezoidal pulse:
If area>((4 G/cm)/(0.0149 G/cm/μs)+8 m s)*4 G/cm, then use a trapezoidal waveform.

Atriangle=A=4 G/cm tramp=(4 G/cm)/SR(G/(cm*ms))

tflattop=areaDES−(tramp+Atriangle))

Once again, it should be appreciated that in the embodiments presented herein, all pulses are treated as trapezoidal to address the constraints of the gradient amplifiers 127. Therefore, for those pulses that would otherwise be considered triangular, they are herein treated as trapezoidal with a flattop duration of 8 ms.

Figure 9:
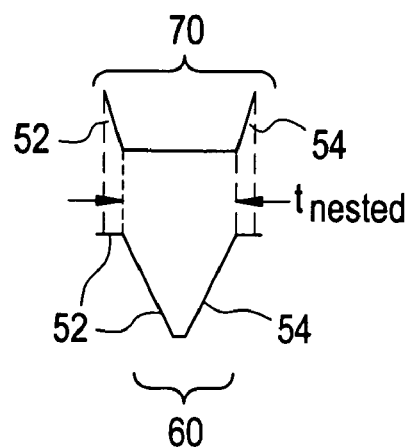
FIG. 9 depicts a nested triangular pulse and a trapezoidal nesting pulse.

Referring once again to FIG. 6 and now to FIG. 9, in an exemplary embodiment exhibiting slice select rephaser/dephaser and readout rephaser/dephaser overlap the method includes a process to evaluate the desired area for each pulse. The desired areas for a first pulse e.g. slice select rephaser/dephaser 24, 26 and second pulse e.g., readout rephaser/dephaser respectively are compared at process block 210 and decision block 220. The pulse exhibiting the smallest area is established as the nested pulse 60, while the pulse exhibiting the larger area is established as the nesting pulse 70. Referring to process block 230, the amplitude and pulse durations for the nested pulse 60, whether triangular or trapezoidal, are determined. At process block 240, the amplitude and pulse durations of the nesting pulse 70 are determined. It will be appreciated that because of the gradient amplifiers 127 the nested pulse is trapezoidal despite even though, ideally, the nested pulse 60 should be configured as triangular. The flat top duration of the nested pulse 60 is therefore the minimum realizable pulse width of the gradient amplifier 127, in this instance, 8 microseconds. Moreover, it should also be appreciated that because of the fixed duration requirement for the nested pulse 60 during the non-slewing portion of the nesting pulse 70, the nesting pulse 70 is inherently trapezoidal. The flat top duration of the nesting pulse 70 is then set equal to the total pulse width of the nested pulse 60. For example:

For the nested pulse 60, $t_{ramp}$, $t_{flattop}$, and $A_{triangle}$ are known. For the nesting pulse, 70 set the flattop or non-slewing duration to the total duration for the nested pulse 60:

$t_{flattop-nesting} = t_{nestedPulse}$ $t_{flattop-nesting} = t_{ramp-nested} + t_{flattop\ nested} + t_{ramp-nested}$ Note, $t_{flattop\ nested}=8$ μs for a minimum duration nested pulse. Ideally, 0 μs for a triangular nested pulse 60.

Process block 240 describes the process to compute the amplitude of the nesting pulse. To facilitate performing the computations, known quantities are the pulse area, $t_{flattop}$, and SR (slew rate).

$$\begin{aligned} area_{DES} &= area_{rectangle} + area_{triangular} \\ &= A*t_{flattop} + A*t_{ramp} \\ &= A*(t_{ramp} + t_{flattop}) \\ &= A*(A/SR + t_{flattop}) \end{aligned}$$

therefore, $$area_{DES}*SR = A^2 + A*SR*t_{flattop}$$

rearranging the equation, yields:

$$A^2 - A*SR*t_{flattop} - area_{DES}*SR = 0$$

This result is a quadratic equation, which can readily be solved for A yielding:

$$A = -SR*t_{flattop}/2 +/- sqrt[SR*t_{flattop}^2 - 4\ area_{DES}*SR]/2$$

Neglecting the incongruent solution, yields the amplitude, A Finally, to compute the ramp times:

$$t_{ramp} = A/SR$$

Returning now to FIG. 6, the process is completed by arranging the respective gradient pulse sequences e.g., 20, 30, and 40 as depicted at process block 250.

Figure 10:
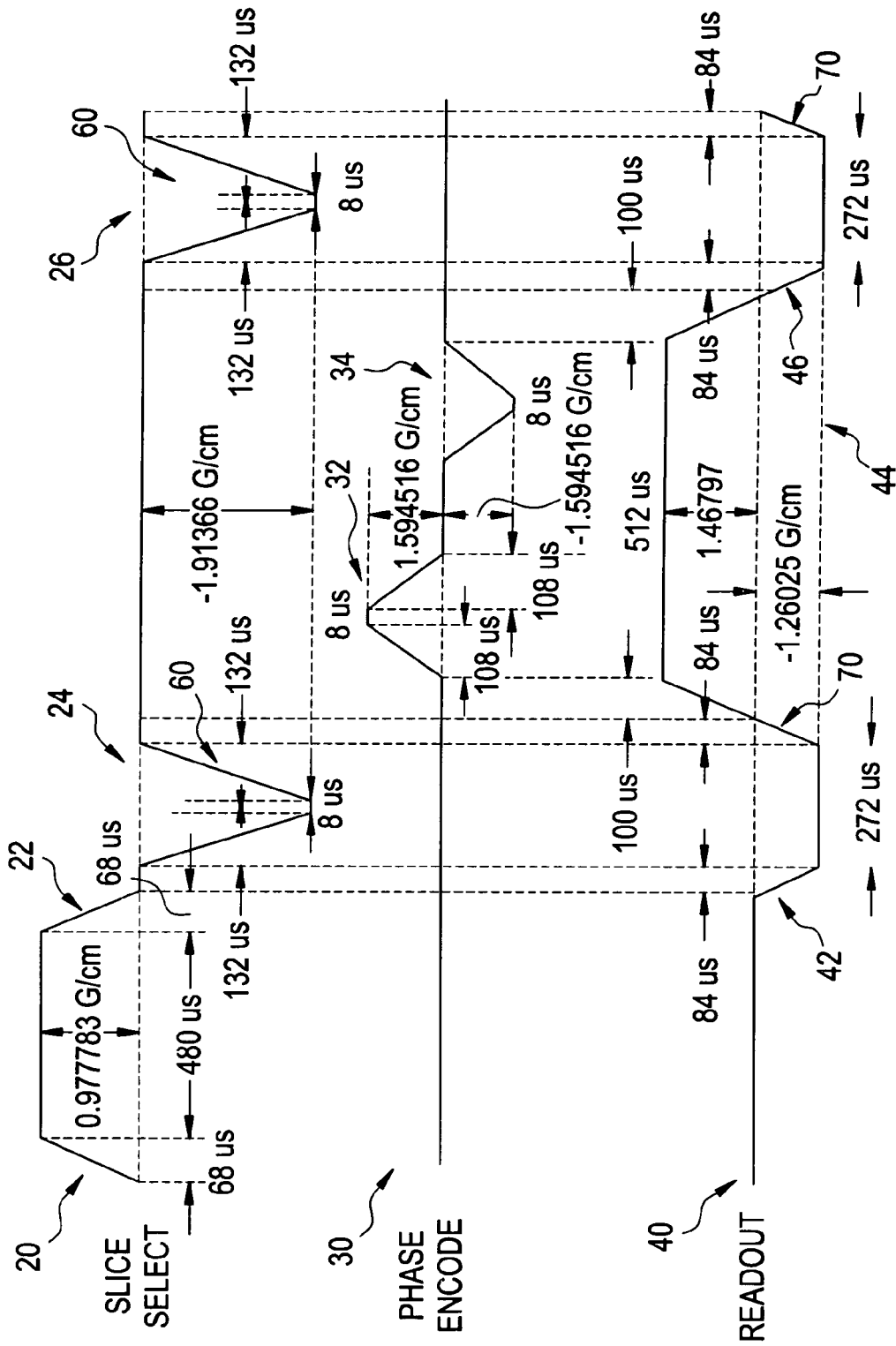
FIG. 10 is a graphic representation of a gradient sequence employing an exemplary embodiment.

Referring not to FIG. 10 is an exemplary depiction of the pulse sequences from FIG. 3 with illustrative pulse amplitudes and durations. This pulse sequence utilizes nested slice select rephaser and dephaser pulses 24, 26 and phase encoding pulse 32 and rewinder pulse 34 overlap with the readout pulse to minimize dB/dt peripheral nerve stimulation effects. Slice select rephaser pulses 24 and dephaser pulses 26 are always triangular with pulse amplitudes of −1.91366 G/cm with pulse ramp widths of 132 μs to a minimum of +/−0.146767 G/cm with pulse ramp widths of 12 μs. Phase encoding flat top widths are 8 ms in duration. Phase encoding pulses 32, 34 are always triangular with pulse amplitudes ranging from a maximum of +/−1.594516 G/cm with pulse ramp widths of 108 μs. Phase encoding flat top widths are 8 μs in duration. Readout prephaser pulses 42 and dephaser pulses 46 are configured as trapezoidal with pulse amplitudes of −1.26025 G/cm with pulse ramp widths of 84 μs and a non-slewing, flat top duration of 272 μs. It should be noted, that for this exemplary sequence, the maximum slew rate of the gradient amplifier 127 is always employed. Other slew rates and configurations of the sequences are possible.

The system and methodology described in the numerous embodiments hereinbefore provides a system and method for nesting gradient pulses and thereby, increasing gradient slew rates and decreasing peripheral nerve stimulation. In addition, the disclosed invention may be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium such as 111 and 112, wherein, when the computer program code is loaded into and executed by a computer, the computer becomes an apparatus for practicing the invention. The present invention can also be embodied in the form of computer program code, for example, whether stored in a storage medium 111, 112, loaded into and/or executed by a computer, or as data signal 110 transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for decreasing gradient field pulse sequence duration and reducing peripheral nerve stimulation with known gradient pulse areas for a magnetic resonance imaging system, the method comprising:
   receiving a first desired area corresponding to a first pulse;
   obtaining a second desired area corresponding to a second pulse;
   selecting said first pulse as a nested pulse if said first desired area is smaller than said second desired area, and establishing said second pulse as a nesting pulse, otherwise selecting said second pulse as said nested pulse and establishing said first pulse as said nesting pulse, said nested pulse having portions coincident with said nesting pulse;
   determining an amplitude and pulse duration for said nested pulse;
   ascertaining an amplitude and pulse duration for said nesting pulse; and
   arranging a plurality of gradient field pulse sequences to include said nested pulse and said nesting pulse.

2. The method of claim 1 wherein said determining further comprises:
   establishing if said nested pulse is triangular or trapezoidal and establishing a flat top time for said nested pulse if it is trapezoidal; and
   calculating a ramp time for said nested pulse.

3. The method of claim 2 wherein said calculating comprises:
   setting a first duration corresponding to said nested pulse equivalent to about a second duration corresponding to a flattop portion of said nesting pulse; and
   calculating a ramp time for said nesting pulse.

4. The method of claim 1 wherein said first pulse is a slice select rephaser pulse and said second pulse is a readout prephaser pulse.

5. The method of claim 1 wherein said first pulse is a readout prephaser pulse and said second pulse is a slice select rephaser pulse.

6. The method of claim 1 wherein said plurality of gradient field pulse sequences includes a slice select pulse sequence, a phase encoding pulse sequence and a readout pulse sequence.

7. The method of claim 6 wherein: said slice select pulse sequence comprises a slice select pulse, a slice select rephaser pulse and a slice select dephaser pulse; said phase encoding pulse sequence includes a phase encoding pulse and a phase encoding rewinder pulse; and said readout pulse sequence includes a readout prephaser pulse, a readout pulse and a readout dephaser pulse.

8. The method of claim 7 wherein said slice select dephaser pulse is configured to be about equivalent to said slice select rephaser pulse.

9. The method of claim 7 wherein said phase encoding rewinder pulse is configured to be about equivalent to said phase encoding pulse but of opposite sign.

10. The method of claim 7 wherein said readout dephaser pulse is configured to be about equivalent to said readout prephaser pulse.

11. The method of claim 1 further including determining an amplitude and duration for a slice select pulse and a readout pulse responsive to a desired area for said slice select pulse and another desired area for said readout pulse.

12. The method of claim 11 wherein said arranging includes configuring said plurality of gradient field pulse sequences to reduce a gradient field pulse sequence duration and maintain established magnetic field constraints.

13. The method of claim 1 further including a third desired area corresponding to a third pulse, wherein said plurality of gradient field pulse sequences includes an initial slew of said third pulse which is occurs during a non-slowing portion of said nested pulse.

14. The method of claim 13 further including computing an amplitude and duration of said third pulse responsive to said third desired area.

15. The method of claim 14 wherein said computing comprises:
establishing if said third pulse is triangular or trapezoidal and establishing a flat top time for said third pulse if it is trapezoidal; and
calculating a ramp time for said third pulse.

16. The method of claim 13 said third pulse is a phase encoding pulse.

17. A system control for decreasing gradient field pulse sequence duration and reducing peripheral nerve stimulation with known gradient pulse areas in a magnetic resonance imaging system, the system control configured to implement a method comprising:
receiving a first desired area corresponding to a first pulse;
obtaining a second desired area corresponding to a second pulse;
selecting said first pulse as a nested pulse if said first desired area is smaller than said second desired area, and establishing said second pulse as a nesting pulse, otherwise selecting said second pulse as said nested pulse and establishing said first pulse as said nesting pulse, said nested pulse having portions coincident with said nesting pulse;
determining an amplitude and pulse duration for said nested pulse;
ascertaining an amplitude and pulse duration for said nesting pulse; and
arranging a plurality of gradient field pulse sequences to include said nested pulse and said nesting pulse.

18. The system control of claim 17 wherein said determining further comprises:
establishing if said nested pulse is triangular or trapezoidal and establishing a flat top time for said nested pulse if it is trapezoidal; and
calculating a ramp time for said nested pulse.

19. The system control of claim 17 wherein said calculating comprises:
setting a first duration corresponding to nested pulse equivalent to about a second duration corresponding to a flattop portion of said nesting pulse; and
calculating a ramp time for said nesting pulse.

20. The system control of claim 17 wherein said first pulse is a slice select rephaser pulse and said second pulse is a readout prephaser pulse.

21. The system control of claim 17 wherein said first pulse is a readout prephaser pulse and said second pulse is a slice select rephaser pulse.

22. The system control of claim 17 wherein said plurality of gradient field pulse sequences includes a slice select pulse sequence, a phase encoding pulse sequence and a readout pulse sequence.

23. The system control of claim 22 wherein: said slice select pulse sequence comprises a slice select pulse, a slice select rephaser pulse and a slice select dephaser pulse; said phase encoding pulse sequence includes a phase encoding pulse and a phase encoding rewinder pulse; and said readout pulse sequence includes a readout prephaser pulse, a readout pulse and a readout dephaser pulse.

24. The system control of claim 23 wherein said slice select dephaser pulse is configured to be about equivalent to said slice select rephaser pulse.

25. The system control of claim 23 wherein said phase encoding rewinder pulse is configured to be about equivalent to said phase encoding pulse but of opposite sign.

26. The system control of claim 23 wherein said readout dephaser pulse is configured to be about equivalent to said readout prephaser pulse.

27. The system control of claim 17 further including determining an amplitude and duration for a slice select pulse and a readout pulse responsive to a desired area for said slice select pulse and another desired area for said readout pulse.

28. The system control of claim 27 wherein said arranging includes configuring said plurality of gradient field pulse sequences to reduce a gradient field pulse sequence duration and maintain established magnetic field constraints.

29. The system control of claim 17 further including a third desired area corresponding to a third pulse, wherein said plurality of gradient field pulse sequences includes an initial slew of said third pulse which is occurs during a non-slewing portion of said nested pulse.

30. The system control of claim 29 further including computing an amplitude and duration of said third pulse responsive to said third desired area.

31. The system control of claim 30 wherein said computing comprises:
establishing if said third pulse is triangular or trapezoidal and establishing a flat top time for said third pulse if it is trapezoidal; and
calculating a ramp time for said third pulse.

32. The system control of claim 29 said third pulse is a phase encoding pulse.

33. A storage medium encoded with a machine-readable computer program code;
said code including instructions for causing a computer to implement a method for decreasing gradient field pulse sequence duration and reducing peripheral nerve stimulation with known gradient pulse areas for a magnetic resonance imaging system, the meted comprising:

receiving a first desired area corresponding to a first pulse;

obtaining a second desired area corresponding to a second pulse;

selecting said first pulse as a nested pulse if said first desired area is smaller than said second desired area, sad establishing said second pulse as a nesting pulse, otherwise selecting said second pulse as said nested pulse and establishing said first pulse as said nesting pulse, said nested pulse having portion coincident with said nesting pulse;

determining an amplitude and pulse duration for said nested pulse;

ascertaining an amplitude and pulse duration far said nesting pulse; and arranging a plurality of gradient field pulse sequences to include said nested pulse and said nesting pulse.

34. An apparatus for decreasing gradient field pulse sequence duration and reducing peripheral nerve stimulation with known gradient pulse areas for a magnetic resonance imaging system, the apparatus comprising:

means for receiving a first desired area corresponding to a first pulse;

means for obtaining a second desired area corresponding to a second pulse;

means for selecting said first pulse as a nested pulse if said first desired area is smaller than said second desired area, and establishing said second pulse as a nesting pulse, otherwise selecting said second pulse as said nested pulse and establishing said first pulse as said nesting pulse, said nested pulse having portions coincident with said nesting pulse;

means for determining an amplitude and pulse duration for said nested pulse;

means for ascertaining an amplitude and pulse duration for said nesting pulse; and means for arranging a plurality of gradient field pulse sequences to include said nested pulse and said nesting pulse.

35. A method for nesting gradient pulse in gradient field pulse sequences with known gradient pulse areas for a magnetic resonance imaging system, comprising:

receiving a slice select rephaser pulse desired area indicative of a desired area for a slice select rephaser pulse;

receiving a readout prephaser pulse desired area indicative of a desired area for a readout prephaser pulse;

selecting said slice select rephaser pulse as a nested pulse if said slice select rephaser pulse desired area is smaller than said readout prephaser pulse desired area, and establishing said readout prephaser pulse as a nesting pulse, otherwise selecting said readout prephaser pulse as said nested pulse and establishing said slice select rephaser pulse as said nesting pulse, said nested pulse having portions coincident with said nesting pulse;

determining an amplitude and pulse duration for said nested pulse;

determining an amplitude and pulse duration for said nesting pulse; and arranging a plurality of gradient field pulse sequences to include said nested pulse and said nesting pulse in a manner that minimizes concurrent slews of any gradient field.

* * * * *